(12) United States Patent
Kim et al.

(10) Patent No.: US 7,595,529 B2
(45) Date of Patent: Sep. 29, 2009

(54) SEMICONDUCTOR INTEGRATED CIRCUIT DEVICES HAVING UPPER PATTERN ALIGNED WITH LOWER PATTERN MOLDED BY SEMICONDUCTOR SUBSTRATE AND METHODS OF FORMING THE SAME

(75) Inventors: Bong-Soo Kim, Gyeonggi-do (KR); Hyeong-Sun Hong, Gyeonggi-do (KR); Soo-Ho Shin, Gyeonggi-do (KR); Ho-In Ryu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/176,263

(22) Filed: Jul. 18, 2008

(65) Prior Publication Data
US 2008/0277795 A1 Nov. 13, 2008

Related U.S. Application Data

(63) Continuation of application No. 11/852,940, filed on Sep. 10, 2007.

(30) Foreign Application Priority Data

Feb. 21, 2007 (KR) .................. 10-2007-0017585
Feb. 27, 2007 (KR) .................. 10-2007-0019755

(51) Int. Cl.
*H01L 21/768* (2006.01)
(52) U.S. Cl. .................. 257/330; 257/E23.145; 257/E21.585; 438/637
(58) Field of Classification Search .......... 257/330, 257/E23.145, E21.585
See application file for complete search history.

(56) References Cited

U.S. PATENT DOCUMENTS

| 6,462,376 | B1 * | 10/2002 | Wahl et al. ................. 257/331 |
| 6,541,815 | B1 * | 4/2003 | Mandelman et al. ........ 257/315 |
| 6,852,597 | B2 * | 2/2005 | Park et al. .................. 438/268 |
| 7,087,956 | B2 | 8/2006 | Umebayashi |
| 7,189,617 | B2 * | 3/2007 | Slesazeck et al. ........... 438/259 |
| 2005/0020085 | A1 * | 1/2005 | Lee et al. .................... 438/700 |
| 2006/0097314 | A1 | 5/2006 | Uchiyama |

FOREIGN PATENT DOCUMENTS

| JP | 7-66297 | 3/1995 |
| KR | 1999-0040755 | 6/1999 |
| KR | 2000-0015029 | 3/2000 |
| KR | 2001-0029029 | 4/2001 |

(Continued)

*Primary Examiner*—Sue Purvis
*Assistant Examiner*—Benjamin P Sandvik
(74) *Attorney, Agent, or Firm*—Marger Johnson & McCollom, P.C.

(57) ABSTRACT

Provided are semiconductor integrated circuit (IC) devices having an upper pattern aligned with a lower pattern molded by a semiconductor substrate and methods of forming the same. In the semiconductor IC devices, the lower pattern contacts the upper pattern using an active region and/or an isolation layer. The methods include preparing a semiconductor substrate having an active region. A lower pattern is formed on the active region. The lower pattern is surrounded by the active region and protrudes from a top surface of the active region. An upper pattern is disposed on the lower pattern. The upper pattern contacts the lower pattern.

30 Claims, 7 Drawing Sheets

FOREIGN PATENT DOCUMENTS

| | | |
|---|---|---|
| KR | 2002-0053538 | 7/2002 |
| KR | 2002-0061061 | 7/2002 |
| KR | 10-2005-0027294 | 3/2005 |
| KR | 10-2005-0062019 | 6/2005 |
| KR | 10-2005-73099 | 7/2005 |
| KR | 10-2005-0101993 | 10/2005 |
| KR | 10-2006-0033961 | 4/2006 |
| KR | 10-2006-0042499 | 5/2006 |

* cited by examiner

SEMICONDUCTOR INTEGRATED CIRCUIT DEVICES HAVING UPPER PATTERN ALIGNED WITH LOWER PATTERN MOLDED BY SEMICONDUCTOR SUBSTRATE AND METHODS OF FORMING THE SAME

CROSS-REFERENCE TO RELATED APPLICATIONS

This application is a continuation of U.S. patent application Ser. No. 11/852,940, filed on Sep. 10, 2007, now pending, which claimed priority from Korean Patent Applications Nos. 10-2007-0017585, filed on Feb. 21, 2007, and 10-2007-0019755, filed on Feb. 27, 2007, the contents of which are hereby incorporated herein by reference in their entirety as if set forth fully herein.

BACKGROUND

Exemplary embodiments of the present invention relate generally to semiconductor integrated circuit (IC) devices and methods of forming the same. More particularly, exemplary embodiments of the present invention relate to semiconductor IC devices having an upper pattern aligned with a lower pattern molded by a semiconductor substrate, and to methods of forming the same.

SUMMARY

As exemplarily described herein, embodiments of the present invention can be characterized as capable of providing semiconductor integrated circuit (IC) devices in which an active region and/or an isolation layer are disposed in a semiconductor substrate and in which a lower pattern is molded by the active region and/or the isolation layer to align an upper pattern with the lower pattern.

As exemplarily described herein, embodiments of the present invention can be characterized as methods of forming semiconductor IC devices in which a lower pattern surrounded by an active region and/or an isolation layer of a semiconductor substrate contacts an upper pattern in a simple manner.

One embodiment exemplarily described herein can be generally characterized as a semiconductor IC device including a semiconductor substrate having an active region. An upper pattern is disposed in a predetermined region of the semiconductor substrate. The upper pattern protrudes upward from a top surface of the active region and extends downward from the top surface of the active region. A lower pattern is disposed below the top surface of the active region. The lower pattern includes a buried plug and a buried capping pattern disposed on the buried plug. The buried plug contacts the upper pattern through the predetermined region of the semiconductor substrate. The buried capping pattern protrudes from the top surface of the active region to surround the upper pattern. The upper pattern has different widths on the buried plug.

Another embodiment exemplarily described herein can be generally characterized as a semiconductor IC device including a semiconductor substrate having an isolation layer. An upper pattern is disposed in a predetermined region of the semiconductor substrate. The upper pattern protrudes upward from a top surface of the isolation layer and extends downward from the top surface of the isolation layer. A lower pattern is disposed below the top surface of the isolation layer. The lower pattern includes a buried plug and a buried capping pattern disposed on the buried plug. The buried plug is surrounded by the upper pattern through the predetermined region of the semiconductor substrate to contact the upper pattern. The buried capping pattern protrudes from the top surface of the isolation layer to surround the upper pattern. The upper pattern has the same width on the buried plug.

Still another embodiment exemplarily described herein can be generally characterized as a semiconductor IC device including a semiconductor substrate having an active region and an isolation layer. The isolation layer surrounds the active region. First and second upper patterns are disposed in predetermined regions of the semiconductor substrate. The first upper pattern protrudes upward from a top surface of the active region and extends downward from the top surface of the active region. The second upper pattern protrudes upward from a top surface of the isolation layer and extends downward from the top surface of the isolation layer. A first lower pattern is disposed below the top surface of the active region. The first lower pattern includes a first buried plug and a first buried capping pattern disposed on the first buried plug. The first buried plug contacts the first upper pattern through one of the predetermined regions of the semiconductor substrate. The first buried capping pattern protrudes from the top surface of the active region to surround the first upper pattern. A second lower pattern is disposed below the top surface of the isolation layer. The second lower pattern includes a second buried plug and a second buried capping pattern disposed on the second buried plug. The second buried plug is surrounded by the second upper pattern through the remaining (or another one of) predetermined regions of the semiconductor substrate to contact the second upper pattern. The second buried capping pattern protrudes from the top surface of the isolation layer to surround the second upper pattern. The first upper pattern has different widths on the first buried plug and the second upper pattern has the same width on the second buried plug.

One embodiment exemplarily described herein can be generally characterized as a method of forming a semiconductor IC device. In the method, a semiconductor substrate having an active region is prepared. A trench is formed in the active region. A lower pattern is formed in the trench. The lower pattern has a buried plug and a buried capping pattern stacked sequentially. The buried capping pattern protrudes from a top surface of the active region defining the trench. An interlayer insulating layer is formed on the active region to cover the lower pattern. A connection hole is formed in the interlayer insulating layer. The connection hole exposes the buried plug and a portion of the active region disposed adjacent to the buried plug. An upper pattern filling the connection hole is formed.

Another embodiment exemplarily described herein can be generally characterized as a method of forming a semiconductor IC device. In the method, a semiconductor substrate having an isolation layer is prepared. A trench is formed in the isolation layer. A lower pattern is formed in the trench. The lower pattern has a buried plug and a buried capping pattern stacked sequentially. The buried capping pattern protrudes from a top surface of the isolation layer defining the trench. An interlayer insulating layer is formed on the isolation layer to cover the lower pattern. A connection hole is formed in the interlayer insulating layer. The connection hole exposes the buried plug and a portion of the isolation layer disposed adjacent to the buried plug and under the buried plug. An upper pattern filling the connection hole is formed.

Yet another embodiment exemplarily described herein can be generally characterized as a method of forming a semiconductor IC device. In the method, a semiconductor substrate having an active region and an isolation layer surrounding the active region is prepared. First and second trenches are formed in the active region and the isolation layer, respectively. First and second lower patterns are formed in the first and second trenches, respectively. The first lower pattern has a first buried plug and a first buried capping pattern stacked sequentially, and the second lower pattern has a second buried plug and a second buried capping pattern stacked sequentially. The first and second buried capping patterns protrude from top surfaces of the active region and the isolation layer, respectively. An interlayer insulating layer is formed on the active region and the isolation layer to cover the first and second lower patterns. First and second connection holes are formed in the interlayer insulating layer. The first connection hole exposes the first buried plug and a portion of the active region disposed adjacent to the first buried plug. The second connection hole exposes the second buried plug and a portion of the isolation layer disposed adjacent to the second buried plug and under the second buried plug. First and second upper patterns are formed to fill the first and second connection holes, respectively.

BRIEF DESCRIPTION OF THE DRAWINGS

The foregoing embodiments of the present invention will be apparent from the description of exemplary embodiments of the invention, as illustrated in the accompanying drawings. The drawings are not necessarily to scale, emphasis instead being placed upon illustrating the principles of the invention.

DETAILED DESCRIPTION

Semiconductor integrated circuit (IC) devices having an upper pattern aligned with a lower pattern molded by a semiconductor substrate and methods of forming the same according to embodiments of the present invention will now be described more fully hereinafter with reference to the accompanying drawings, in which exemplary embodiments of the invention are shown.

Figure 1:
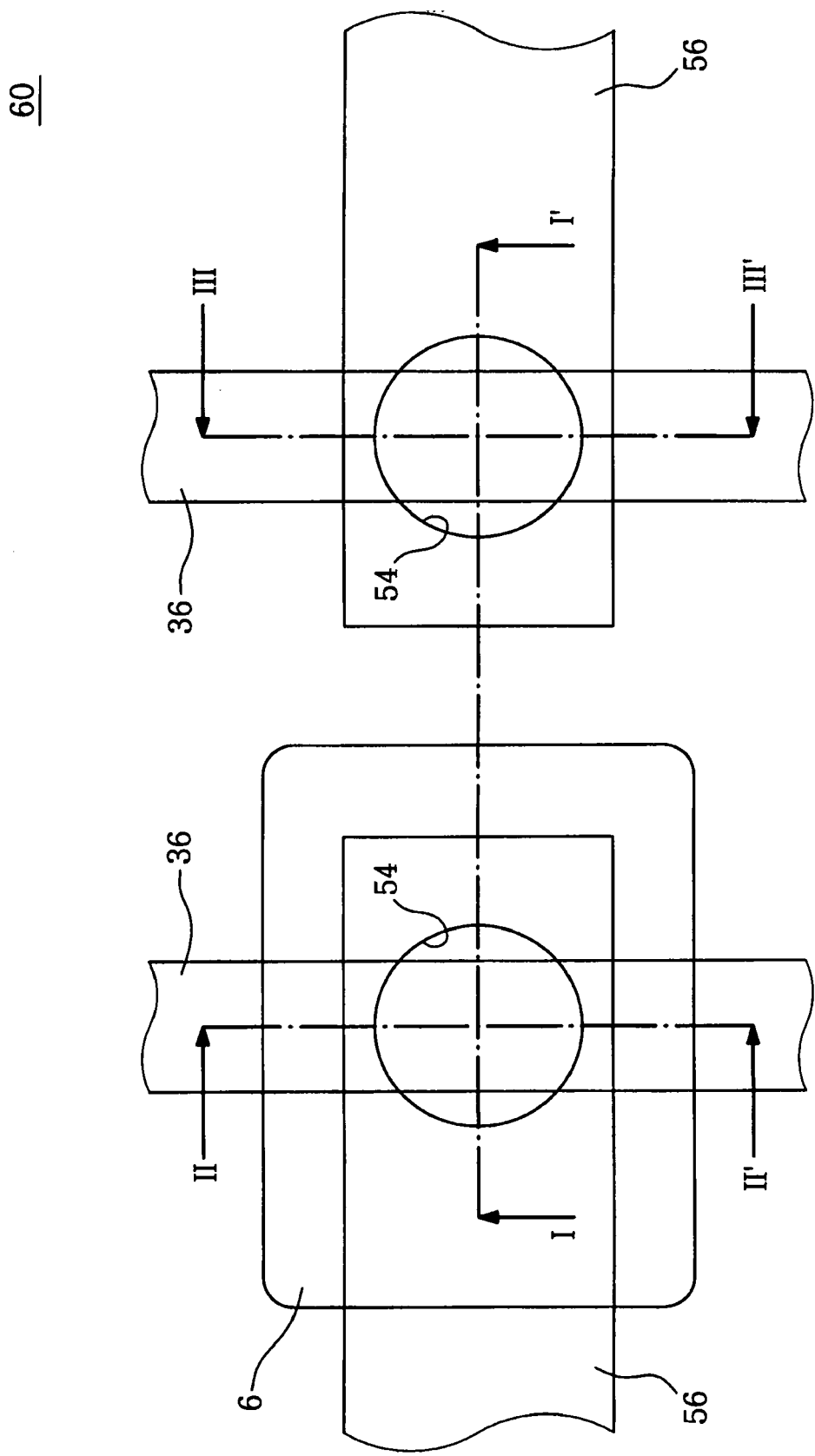
FIG. 1 illustrates the layout of a semiconductor integrated circuit (IC) device according to an exemplary embodiment of the present invention.
Figure 2:
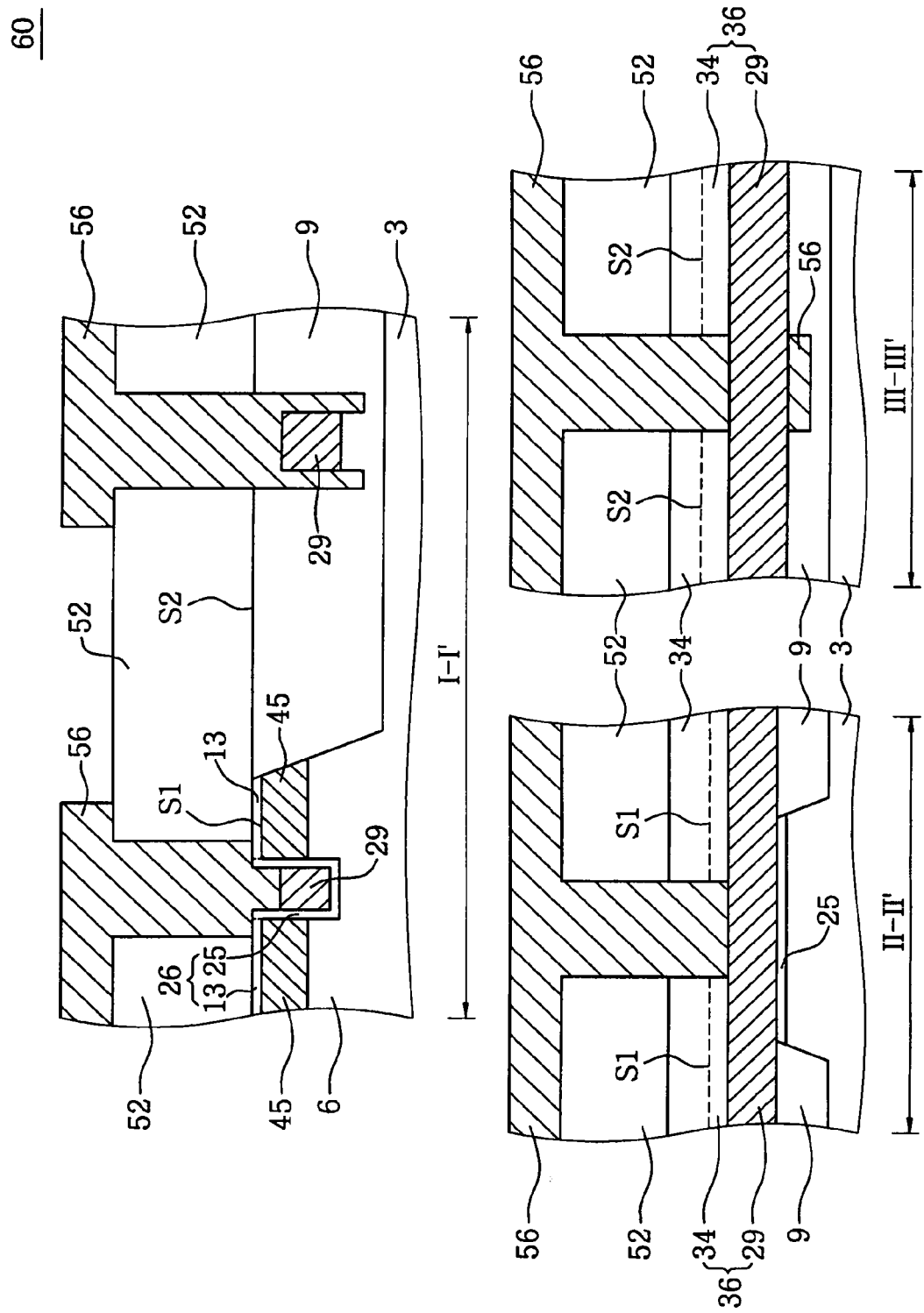
FIG. 2 illustrates cross-sectional views of the semiconductor IC device shown in FIG. 1, which are taken along lines I-I', II-II' and III-III'.

FIG. 1 illustrates the layout of a semiconductor IC device according to an exemplary embodiment of the present invention. FIG. 2 illustrates cross-sectional views of the semiconductor IC device shown in FIG. 1, which are taken along lines I-I', II-II' and III-III'.

Referring to FIGS. 1 and 2, a semiconductor IC device 60 may include a semiconductor substrate 3 having an isolation layer 9 and an active region 6. The active region 6 may be disposed in a semiconductor substrate 3 and be surrounded by the isolation layer 9. Buried plugs 29 may be disposed in predetermined regions of the semiconductor substrate 3 as shown in the cross-sectional view taken along line I-I'. A selected one of the buried plugs 29 may be molded by the isolation layer 9 and the active region 6. Remaining ones of the buried plugs 29 may be molded by the isolation layer 9. The isolation layer 9 may be an insulating layer. The buried plugs 29 may be formed of a conductive material. The buried plugs 29 may be provided as gates, as known to one of ordinary skill in the art. In addition to the gates, the buried plugs 29 may be provided as other discrete devices and/or circuit interconnection lines.

As shown in the cross-sectional views taken along lines II-II' and III-III', buried capping patterns 34 may be disposed on respective ones of the buried plugs 29. The buried capping patterns 34 may protrude from the active region 6 and top surfaces S1 and S2 of the isolation layer 9, across the active region 6 and the isolation layer 9. The buried capping patterns 34 may be formed of an insulating material. The buried capping patterns 34 and buried plugs 29, together, may constitute lower patterns 36. As shown in the cross-sectional view taken along line I-I', impurity diffusion regions 45, each of which is disposed adjacent to one of the lower patterns 36 and overlaps a corresponding buried plug 29, may be formed in the active region 6. The impurity diffusion regions 45 may include a dopant material having a conductivity-type opposite a conductivity of the semiconductor substrate 3.

Referring again to FIGS. 1 and 2, upper patterns 56 may be disposed on respective ones of the lower patterns 36, as shown in the cross-sectional views taken along lines I-I', II-II' and III-III'. A selected one of the upper patterns 56 may be aligned with the active region 6, as shown in the cross-sectional views taken along lines I-I' and II-II'. For example, the selected one of the upper patterns 56 may extend downward from the top surface S1 of the active region 6 and contact the buried plug 29 through the buried capping pattern 34. Furthermore, the selected one of the upper patterns 56 may protrude from the top surface S1 of the active region 6. In this case, the selected one of the upper patterns 56 may be formed to have different widths on the buried plug 29.

As shown in the cross-sectional views taken along lines I-I' and III-III', the remaining upper patterns 56 may be aligned with the isolation layer 9. For example, each of the remaining upper patterns 56 may extend downward from the top surface S2 of the isolation layer 9 and contact the buried plug 29 through the buried capping pattern 34. Each of the remaining upper patterns 56 may be formed in the isolation layer 9 and surround the buried plug 29 as shown in the cross-sectional view taken along line I-I'. Accordingly, each of the remaining upper patterns 56 may protrude downward from the buried plug 29 as shown in the cross-sectional view taken along line III-III'. In addition, the remaining upper patterns 56 may protrude from the top surface S2 of the isolation layer 9. The remaining upper patterns 56 may be formed to the same width on the buried plug 29.

Each of the upper patterns 56 may be formed of at least one conductive material. The upper patterns 56 may be provided as bit line patterns, as known to one of ordinary skill in the art, and/or other circuit interconnection lines. An interconnection insulating layer 26 may be interposed between the upper pattern 56 and the active region 6 and between the lower pattern 36 and the active region 6, as shown in the cross-sectional views taken along lines I-I' and II-II'. The interconnection insulating layer 26 may include different insulating layers 13 and 25 interposed between the active region 6 and the upper pattern 56 and between the active region 6 and the lower pattern 36, respectively. A planarization insulating layer 52 may be formed on the lower pad layer 13 and the isolation layer 9 to cover the lower patterns 36 as shown in the cross-sectional views taken along lines I-I', II-II' and III-III'.

Hereinafter, methods of forming a semiconductor IC device having an upper pattern aligned with a lower pattern molded by a semiconductor substrate according to an exemplary embodiment of the present invention will be described with reference to FIGS. 3 through 7.

FIGS. 3 through 7 are cross-sectional views of the semiconductor IC device shown in FIG. 1, which are taken along lines I-I', II-II' and III-III' to illustrate a method of forming the semiconductor IC device.

Figure 3:
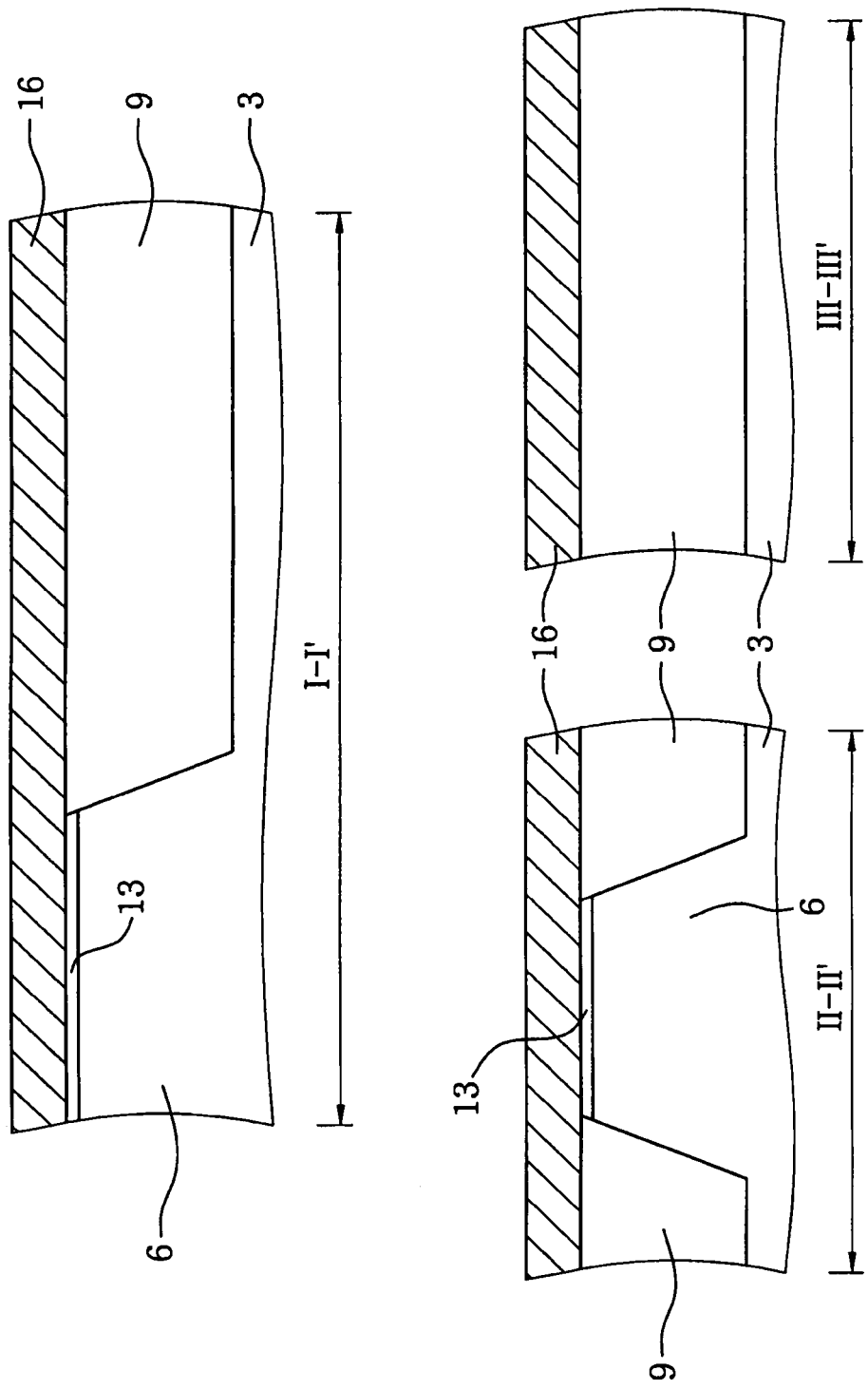
FIGS. 3 through 7 are cross-sectional views of the semiconductor IC device shown in FIG. 1, which are taken along lines I-I', II-II' and III-III' to illustrate a method of forming the semiconductor IC device.

Referring to FIGS. 1 and 3, an active region 6 and an isolation layer 9 may be formed in a semiconductor substrate 3, as shown in the cross-sectional views taken along lines I-I', II-II' and III-III'. The isolation layer 9 may be formed in the semiconductor substrate 3 to define the active region 6. A lower pad layer 13 may be formed on the semiconductor layer 3, as shown in the cross-sectional views taken along lines I-I' and II-II'. The lower pad layer 13 may be formed on the active region 6 using the isolation layer 9 as a mask. The lower pad layer 13 may be formed of an insulating material.

In one embodiment, the lower pad layer 13 may be formed of silicon oxide. In another embodiment, the lower pad layer 13 may be formed of a material obtained by inserting metal atoms and/or base metal atoms into a silicon oxide lattice. An intermediate pad layer 16 may be formed on the lower pad layer 13, as shown in the cross-sectional views taken along lines I-I', II-II' and III-III'. The intermediate pad layer 16 may be formed across the active region 6 and the isolation layer 9. The intermediate pad layer 16 may be formed of a conductive material.

Figure 4:
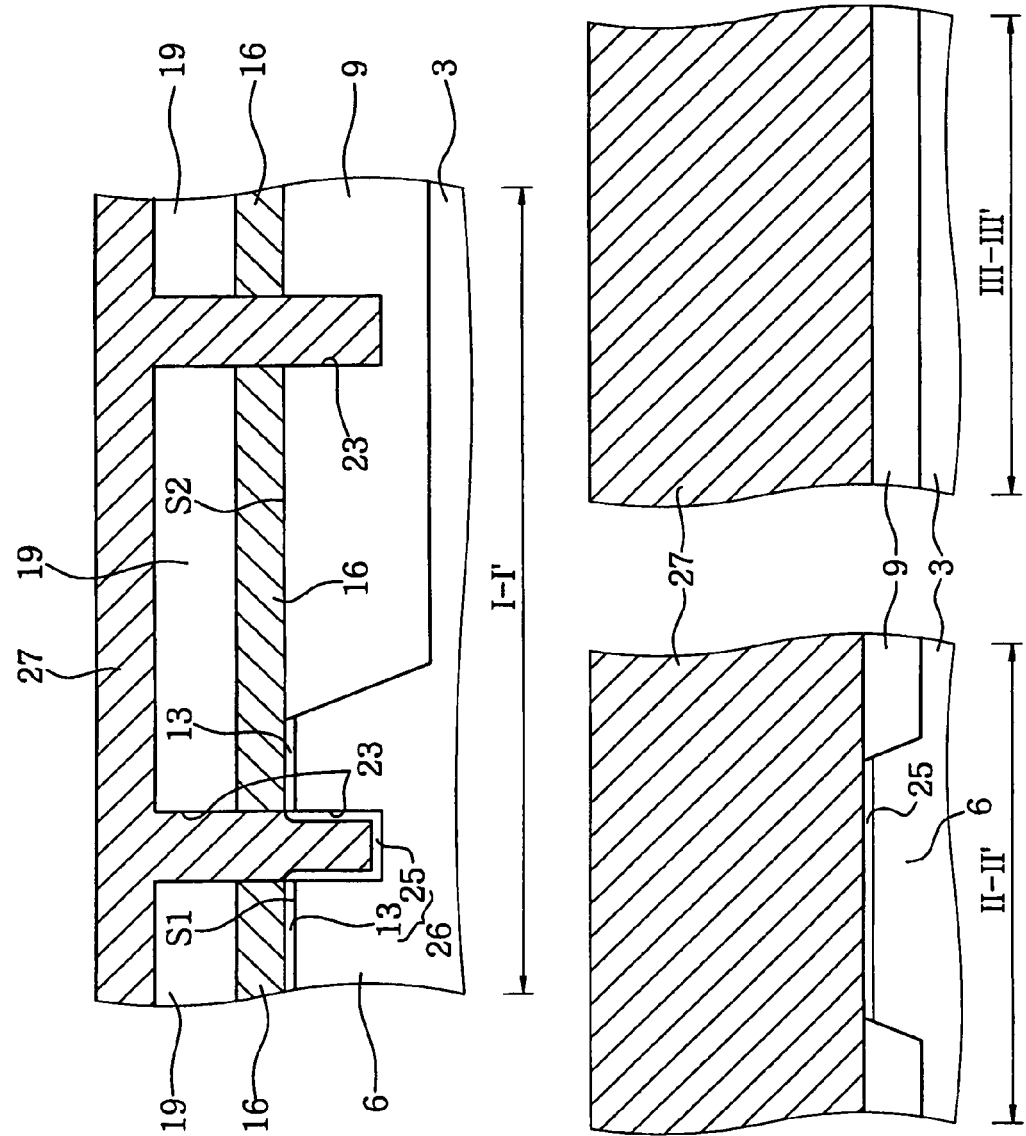

Referring to FIGS. 1 and 4, an upper pad layer 19 may be formed on the intermediate pad layer 16. The upper pad layer 19 may be formed of a material having a different etch rate from the intermediate pad layer 16 and the lower pad layer 13. In one embodiment, the upper pad layer 19 may be formed of silicon nitride. A photoresist layer may be formed on the upper pad layer 19. The photoresist layer may be formed using a known semiconductor photolithography process. The photoresist layer may be formed to have openings exposing portions of the upper pad layer 19 on the active region 6 and the isolation layer 9.

Thereafter, the upper pad layer 19, the intermediate pad layer 16, the lower pad layer 13, the isolation layer 9, and the active region 6 are etched using the photoresist layer as an etch mask, thereby forming trenches 23, as shown in the cross-sectional view taken along line I-I'. In the illustrated embodiment, one of the trenches 23 may sequentially penetrate the upper pad layer 19, the intermediate pad layer 16, and the lower pad layer 13 and be formed to a predetermined depth below a top surface S1 of the active region 6. The remaining trenches 23 may sequentially penetrate the upper pad layer 19, the intermediate pad layer 16, and the lower pad layer 13 and be formed to a predetermined depth below a top surface S2 of the isolation layer 9. After the trenches 23 are formed, the photoresist layer is removed from the semiconductor substrate 3.

A buried insulating layer 25 is formed in the active region 6 using the upper pad layer 19, the intermediate pad layer 16, and the lower pad layer 13 as a mask, as shown in the cross-sectional view taken along lines I-I' and II-II'. Accordingly, the buried insulating layer 25 may be formed only within the trench 23 of the active region 6. In one embodiment, the buried insulating layer 25 may be formed of silicon oxide. In another embodiment, the buried insulating layer 25 may be formed of a material obtained by inserting metal atoms and/or base metal atoms into a silicon oxide lattice. The buried insulating layer 25 and the lower pad layer 13 may constitute an interconnection insulating layer 26. In one embodiment, the lower pad layer 13 and the buried insulating layer 25 may include the same materials. In one embodiment, the lower pad layer 13 and the buried insulating layer 25 may include different materials.

A buried layer 27 may be formed on the upper pad layer 19 to fill the trenches 23, as shown in the cross-sectional views taken along lines I-I', II-II' and III-III'. The buried layer 27 may be formed of a conductive material having a different etch rate from the intermediate pad layer 16. In one embodiment, the buried layer 27 may be formed of titanium nitride (TiN).

Figure 5:
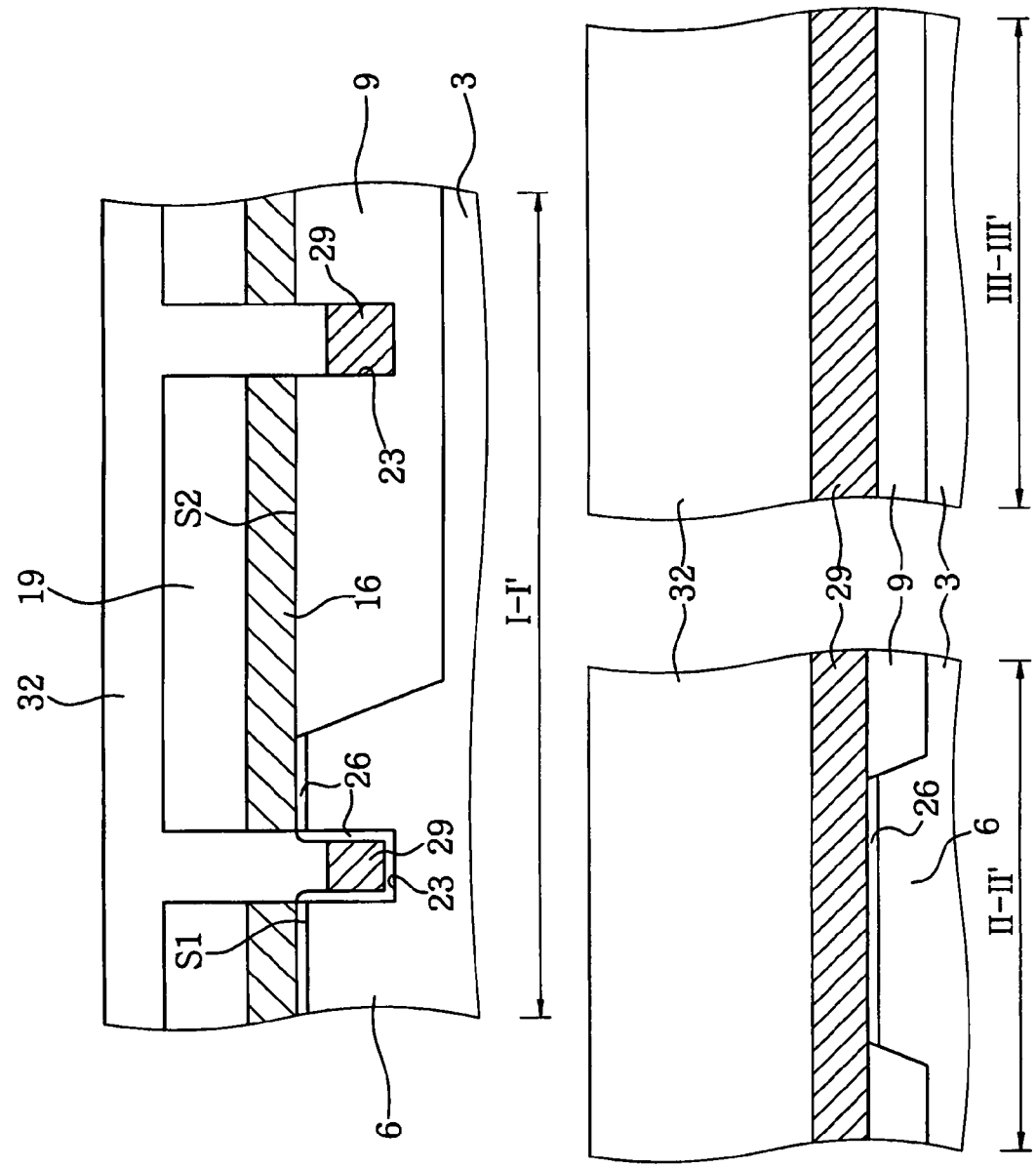

Referring to FIGS. 1 and 5, the buried layer 27 may be etched back using the upper pad layer 19, the intermediate pad layer 16, and the lower pad layer 13 as an etch buffer layer, thereby forming buried plugs 29 that partially fill the trenches 23, as shown in the cross-sectional views taken along lines I-I', II-II' and III-III'. The buried plugs 29 may be formed below the top surfaces S1 and S2 of the active region 6 and the isolation layer 9. A buried capping layer 32 may be formed on the upper pad layer 19 to cover the buried plugs 29 and fill the trenches 23. The buried capping layer 32 may be formed of an insulating material having the same etch rate as the upper pad layer 19.

Figure 6:
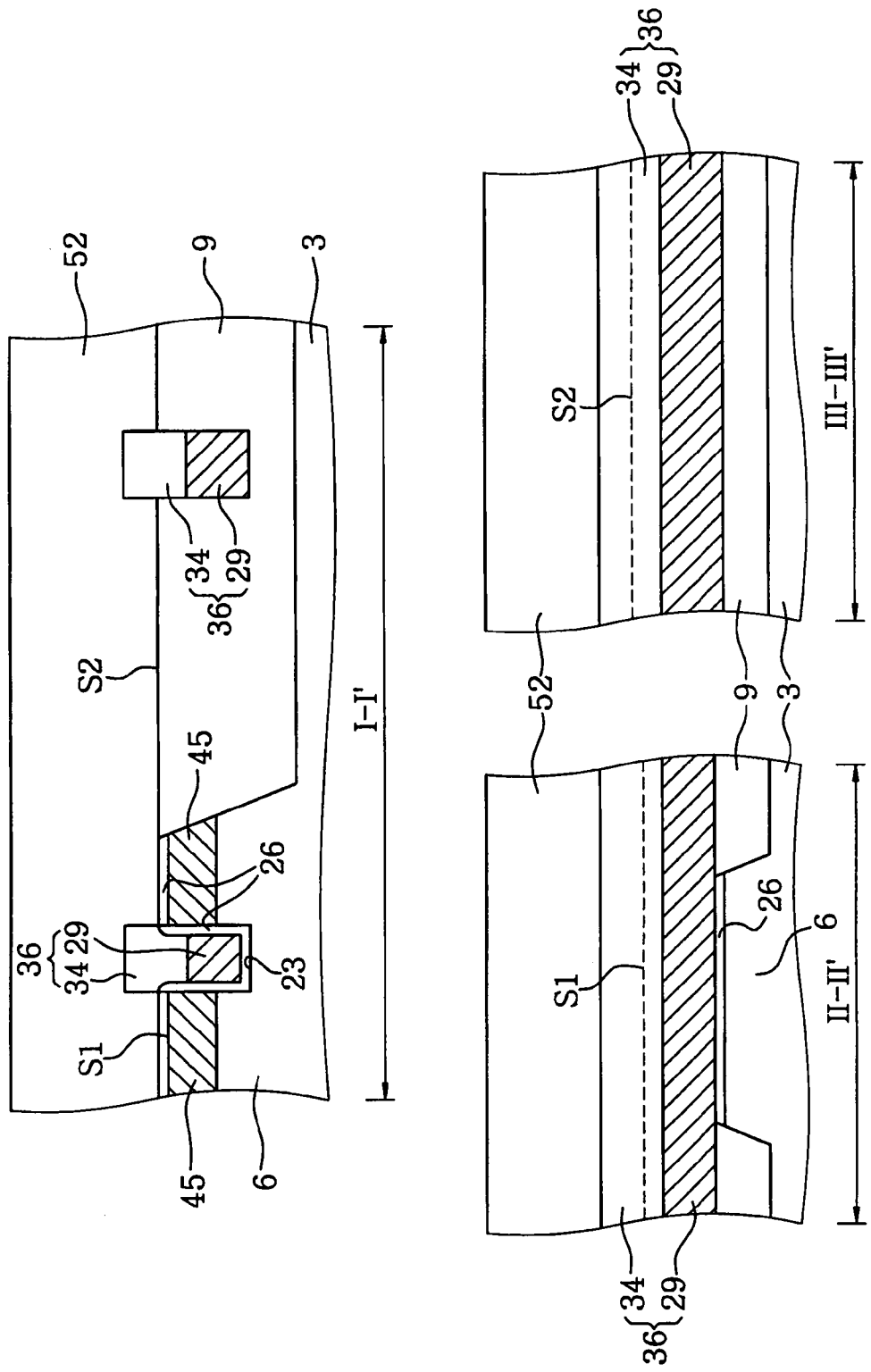

Referring to FIGS. 1 and 6, the buried capping layer 32 and the upper pad layer 19 may be etched to expose the intermediate pad layer 16. Thereafter, the intermediate pad layer 16 may be removed from the semiconductor substrate 3. As a result, buried capping patterns 34 may be formed on respective ones of the buried plugs 29, as shown in the cross-sectional views taken along lines I-I', II-II' and III-III'. In the illustrated embodiment, the buried capping patterns 34 may protrude from the top surfaces S1 and S2 of the active region 6 and the isolation layer 9. One of the buried capping patterns 34 may be surrounded by the interconnection insulating layer 26 on the active region 6. The remaining buried capping patterns 34 may be surrounded by the isolation layer 9. The buried capping patterns 34 and buried plugs 29, together, may constitute lower patterns 36

As shown in FIG. 1, a selected one of the lower patterns 36 may be formed across the active region 6 and the isolation layer 9. As also shown in FIG. 1, the remaining lower patterns 36 may be formed across the isolation layer 9 as shown in FIG. 1. Impurity diffusion regions 45 may be formed in the active region 6 using the lower patterns 36 and the isolation layer 9 as a mask, as shown in the cross-sectional view taken along line I-I'. The impurity diffusion regions 45 may be formed adjacent to the selected one of the lower patterns 36 disposed on the active region 6 and overlap the buried plug 29. The impurity diffusion regions 45 may be include a dopant material having a conductivity-type opposite a conductivity of the semiconductor substrate 3. A planarization insulating layer 52 may be formed on the lower pad layer 13 and the isolation layer 9 to cover the lower patterns 36 as shown in the cross-sectional views taken along lines I-I', II-II' and III-III'. In one embodiment, the planarization insulating layer 52 may be formed of an insulating material having the same etch rate as the lower pad layer 13. In another embodiment, the planarization insulating layer 52 may be formed of an insulating material having a different etch rate from the lower pad layer 13.

Figure 7:
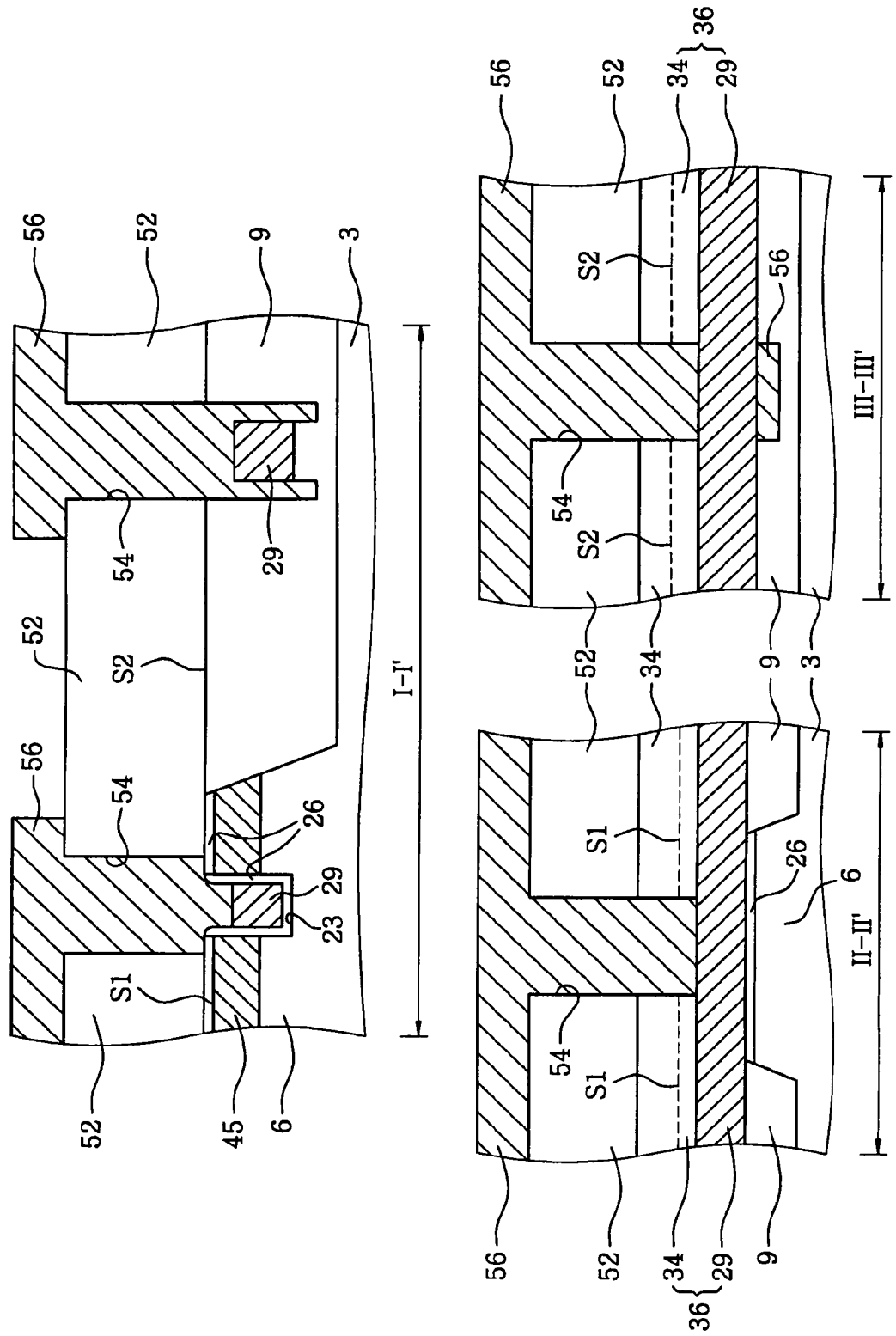

Referring to FIGS. 1 and 7, a photoresist layer (not shown) may be formed on the planarization insulating layer 52. The photoresist layer may be formed to have openings exposing portions of the planarization insulating layer 52 on the active region 6 and the isolation layer 9. The planarization insulating layer 52, the isolation layer 9, and the buried capping patterns 34 may be etched using the photoresist layer as an etch mask and using the interconnection insulating layer 26 and the buried plugs 29 as an etch buffer layer, thereby forming connection holes 54 as shown in the cross-sectional views taken along lines I-I', II-II' and III-III'. A selected one of the connection holes 54 may be aligned with the active region 6. The selected one of the connection holes 54 may be formed to expose the interconnection insulating layer 26 and the buried plug 29, as shown in the cross-sectional views taken along lines I-I' and II-II'. The remaining connection holes 54 may be disposed in the isolation layer 9. The remaining connection holes 54 may be formed to expose the isolation layer 9 adjacent to and under the buried plug 29, as shown in the cross-sectional views taken along lines I-I' and III-III'.

After the connection holes 54 are formed, the photoresist layer may be removed from the semiconductor substrate 3. Thereafter, an electrode layer (not shown) may be formed on the planarization insulating layer 52 to fill the connection holes 54. The electrode layer may be formed of at least one conductive material. Photoresist patterns (not shown) may be formed on the electrode layer. The photoresist patterns may be formed using a known semiconductor photolithography process. The photoresist patterns may be aligned with respective ones of the connection holes 54. The electrode layer may be etched using the photoresist patterns as an etch mask until the planarization insulating layer 52 is exposed, thereby forming upper patterns 56, as shown in the cross-sectional views taken along lines I-I', II-II' and III-III'. After the upper patterns 56 are formed, the photoresist patterns are removed from the semiconductor substrate 3.

In the illustrated embodiment, a selected one of the upper patterns 56 may be disposed in the active region 6 and contact the buried plug 29 through the buried capping pattern 34. Each of the remaining upper patterns 56 may be disposed in the isolation layer 9 and contact the buried plug 29 through the buried capping pattern 34. In this case, each of the remaining upper patterns 56 may surround the buried plug 29 and protrude from the buried plug 29 toward the semiconductor substrate 3. The upper patterns 56 may be provided as bit line patterns or other circuit interconnection lines. The upper patterns 56 and the lower patterns 36, together, may constitute a semiconductor IC device 60.

As described above, the present invention provides semiconductor IC devices having an upper pattern aligned with a lower pattern molded by a semiconductor substrate and methods of forming the same. As a result, the lower pattern can contact the upper pattern by a simpler process using an active region and/or an isolation layer of the semiconductor substrate than the conventional art.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A semiconductor integrated circuit device comprising:
   a semiconductor substrate having an isolation layer;
   an upper pattern disposed in a predetermined region of the semiconductor substrate, the upper pattern protruding upward from a top surface of the isolation layer and extending downward from the top surface of the isolation layer; and
   a lower pattern including a buried plug disposed below the top surface of the isolation layer to be surrounded by the upper pattern through the predetermined region of the semiconductor substrate to contact the upper pattern and a buried capping pattern disposed on the buried plug and protruding from the top surface of the isolation layer to surround the upper pattern,
   wherein the upper pattern has the same width on the buried plug along a direction toward the top surface of the isolation layer.

2. The device according to claim 1, wherein the upper pattern includes a bit line pattern, and is formed of at least one conductive material.

3. The device according to claim 2, wherein the buried plug and the buried capping pattern are formed of a conductive material and an insulating material, respectively, and the lower pattern is a selected gate pattern.

4. A semiconductor integrated circuit device comprising:
   a semiconductor substrate having an active region and an isolation layer surrounding the active region;
   first and second upper patterns respectively disposed in predetermined regions of the semiconductor substrate, the first upper pattern protruding upward from a top surface of the active region and extending downward from the top surface of the active region, the second upper pattern protruding upward from a top surface of the isolation layer and extending downward from the top surface of the isolation layer;
   a first lower pattern including a first buried plug disposed below the top surface of the active region to contact the first upper pattern through one of the predetermined regions of the semiconductor substrate and a first buried capping pattern disposed on the first buried plug and protruding from the top surface of the active region to surround the first upper pattern; and
   a second lower pattern including a second buried plug disposed below the top surface of the isolation layer to be surrounded by the second upper pattern through the remaining predetermined region of the semiconductor substrate to contact the second upper pattern, and the a second buried capping pattern disposed on the second buried plug and protruding from the top surface of the isolation layer to surround the second upper pattern,
   wherein the first upper pattern has different widths on the first buried plug along a direction toward the top surface of the active region, and wherein the second upper pattern has the same width on the second buried plug along a direction toward the top surface of the isolation layer.

5. The device according to claim 4, wherein each of the first and second upper patterns includes a bit line pattern, and is formed of at least one conductive material.

6. The device according to claim 5, further comprising:
   an interconnection insulating layer interposed between the active region and the first upper pattern and between the active region and the first lower pattern; and
   impurity diffusion regions disposed in the active region and disposed adjacent to the first lower pattern to overlap the first buried plug,
   wherein the first buried plug and the first buried capping pattern are formed of a conductive material and an insulating material, respectively, the interconnection insulating layer is formed of different materials between the active region and the first upper pattern and between the active region and the first lower pattern, respectively, and the first lower pattern is a gate pattern.

7. The device according to claim 5, further comprising:
   an interconnection insulating layer interposed between the active region and the first upper pattern and between the active region and the first lower pattern; and
   impurity diffusion regions disposed in the active region and disposed adjacent to the first lower pattern to overlap the first buried plug,
   wherein the first buried plug and the first buried capping pattern are formed of a conductive material and an insulating material, respectively, the interconnection insulating layer is formed of the same material between the active region and the first upper pattern and between the active region and the first lower pattern, and the first lower pattern is a gate pattern.

8. The device according to claim 5, wherein the second buried plug and the second buried capping pattern are formed of a conductive material and an insulating material, respectively, and the second lower pattern is a gate pattern.

9. A method of forming a semiconductor integrated circuit device, comprising:
preparing a semiconductor substrate having an active region;
forming a trench in the active region;
forming a lower pattern in the trench, the lower pattern having a buried plug and a buried capping pattern stacked sequentially, the buried capping pattern protruding from a top surface of the active region defining the trench;
forming an interlayer insulating layer on the active region to cover the lower pattern;
forming a connection hole in the interlayer insulating layer, the connection hole exposing the buried plug and the active region adjacent to the buried plug; and
forming an upper pattern filling the connection hole,
wherein the forming of the trench comprises:
forming a material layer on the active region;
forming a photoresist layer on the material layer, the photoresist layer having an opening exposing the material layer;
sequentially etching the material layer and the semiconductor substrate using the photoresist layer as an etch mask; and
removing the photoresist layer from the semiconductor substrate,
wherein the material layer is formed of at least one material, and
wherein the forming of the lower pattern comprises:
forming a buried layer on the material layer to fill the trench;
etching back the buried layer using the material layer as an etch buffer layer to form the buried plug partially filling the trench;
forming a buried capping layer on the material layer to cover the buried plug and fill the trench;
partially etching the buried capping layer and the material layer to form the buried capping pattern on the buried plug; and
removing the material layer from the semiconductor substrate.

10. The method according to claim 9, wherein the forming of the upper pattern comprises:
forming an electrode layer on the interlayer insulating layer to fill the connection hole;
forming a photoresist pattern on the electrode layer to correspond to the upper pattern;
etching the electrode layer using the photoresist pattern as an etch mask until the interlayer insulating layer is exposed; and
removing the photoresist pattern from the semiconductor substrate.

11. The method according to claim 10, wherein the electrode layer is formed of at least one conductive material, and the upper pattern is a bit line pattern.

12. The method according to claim 11, wherein the forming of the connection hole comprises:
forming a photoresist layer on the interlayer insulating layer, the photoresist layer having an opening exposing the interlayer insulating layer and overlapping the buried plug;
sequentially etching the interlayer insulating layer and the buried capping pattern using the photoresist layer as an etch mask and using the active region and the buried plug as an etch buffer layer; and
removing the photoresist layer from the semiconductor substrate.

13. The method according to claim 9, further comprising:
forming an interconnection insulating layer between the active region and the upper pattern and between the active region and the lower pattern; and
forming impurity diffusion regions in the active region to be adjacent to the lower pattern and overlap the buried plug,
wherein the buried plug and the buried capping pattern are formed of a conductive material and an insulating material, respectively, the lower pattern is a gate pattern, and the interconnection insulating layer is formed of different materials between the active region and the upper pattern and between the active region and the lower pattern, respectively.

14. The method according to claim 9, further comprising:
forming an interconnection insulating layer between the active region and the upper pattern and between the active region and the lower pattern; and
forming impurity diffusion regions in the active region to be adjacent to the lower pattern and overlap the buried plug,
wherein the buried plug and the buried capping pattern are formed of a conductive material and an insulating material, respectively, the lower pattern is a gate pattern, and the interconnection insulating layer is formed of the same material between the active region and the upper pattern and between the active region and the lower pattern.

15. A method of forming a semiconductor integrated circuit device, comprising:
preparing a semiconductor substrate having an isolation layer;
forming a trench in the isolation layer;
forming a lower pattern in the trench, the lower pattern having a buried plug and a buried capping pattern stacked sequentially, the buried capping pattern protruding from a top surface of the isolation layer defining the trench;
forming an interlayer insulating layer on the isolation layer to cover the lower pattern;
forming a connection hole in the interlayer insulating layer, the connection hole exposing the buried plug and the isolation layer adjacent to and under the buried plug; and
forming an upper pattern filling the connection hole.

16. The method according to claim 15, wherein the forming of the upper pattern comprises:
forming an electrode layer on the interlayer insulating layer to fill the connection hole;
forming a photoresist pattern on the electrode layer to correspond to the upper pattern;
etching the electrode layer using the photoresist pattern as an etch mask until the interlayer insulating layer is exposed; and
removing the photoresist pattern from the semiconductor substrate.

17. The method according to claim 16, wherein the electrode layer is formed of at least one conductive material, and the upper pattern is a bit line pattern.

18. The method according to claim 17, wherein the forming of the connection hole comprises:
    forming a photoresist layer on the interlayer insulating layer, the photoresist layer having an opening exposing the interlayer insulating layer and overlapping the buried plug;
    etching the interlayer insulating layer, the isolation layer, the buried capping pattern using the photoresist layer and the buried plug as an etch mask and an etch buffer layer, respectively; and
    removing the photoresist layer from the semiconductor substrate.

19. The method according to claim 15, wherein the forming of the trench comprises:
    forming a material layer on the isolation layer;
    forming a photoresist layer on the material layer, the photoresist layer having an opening exposing the material layer;
    sequentially etching the material layer and the isolation layer using the photoresist layer as an etch mask; and
    removing the photoresist layer from the semiconductor substrate,
    wherein the material layer is formed of at least one material.

20. The method according to claim 19, wherein the forming of the lower pattern comprises:
    forming a buried layer on the material layer to fill the trench;
    etching back the buried layer using the material layer as an etch buffer layer to form the buried plug partially filling the trench;
    forming a buried capping layer on the material layer to cover the buried plug and fill the trench;
    partially etching the buried capping layer and the material layer to form the buried capping pattern on the buried plug; and
    removing the material layer from the semiconductor substrate.

21. The method according to claim 15, wherein the buried plug and the buried capping pattern are formed of a conductive material and an insulating material, respectively, and the lower pattern is a gate pattern.

22. A method of forming a semiconductor integrated circuit device, comprising:
    preparing a semiconductor substrate having an active region and an isolation layer surrounding the active region;
    forming first and second trenches in the active region and the isolation layer, respectively;
    forming first and second lower patterns in the first and second trenches, respectively, the first lower pattern having a first buried plug and a first buried capping pattern stacked sequentially, the second lower pattern having a second buried plug and a second buried capping pattern stacked sequentially, the first and second buried capping patterns protruding from top surfaces of the active region and the isolation layer, respectively;
    forming an interlayer insulating layer on the active region and the isolation layer to cover the first and second lower patterns;
    forming first and second connection holes in the interlayer insulating layer, the first connection hole exposing the first buried plug and the active region adjacent to the first buried plug, the second connection hole exposing the second buried plug and the isolation layer adjacent to and under the second buried plug; and
    forming first and second upper patterns filling the first and second connection holes, respectively.

23. The method according to claim 22, wherein the forming of the first and second upper patterns comprises:
    forming an electrode layer on the interlayer insulating layer to fill the first and second connection holes;
    forming photoresist patterns on the electrode layer to correspond to the first and second upper patterns, respectively;
    etching the electrode layer using the photoresist patterns as an etch mask until the interlayer insulating layer is exposed; and
    removing the photoresist patterns from the semiconductor substrate.

24. The method according to claim 23, wherein the electrode layer is formed of at least one conductive material, and each of the first and second upper patterns is a bit line pattern.

25. The method according to claim 24, wherein the forming of the first and second connection holes comprises:
    forming a photoresist layer on the interlayer insulating layer, the photoresist layer having openings exposing the interlayer insulating layer and respectively overlapping the first and second buried plugs;
    etching the interlayer insulating layer, the isolation layer, and the first and second buried capping patterns using the photoresist layer as an etch mask and using the first and second buried plugs and the active region as an etch buffer layer; and
    removing the photoresist layer from the semiconductor substrate.

26. The method according to claim 22, wherein the forming of the first and second trenches comprises:
    forming a material layer on the active region and the isolation layer;
    forming a photoresist layer on the material layer, the photoresist layer having openings respectively disposed on the active region and the isolation layer and exposing the material layer;
    etching the material layer, the active region, and the isolation layer using the photoresist layer as an etch mask; and
    removing the photoresist layer from the semiconductor substrate,
    wherein the material layer is formed of at least one material.

27. The method according to claim 26, wherein the forming of the first and second lower patterns comprises:
    forming a buried layer on the material layer to fill the first and second trenches;
    etching back the buried layer using the material layer as an etch buffer layer to form the first and second buried plugs partially filling the first and second trenches, respectively;
    forming a buried capping layer on the material layer to cover the first and second buried plugs and fill the first and second trenches;
    partially etching the buried capping layer and the material layer to respectively form the first and second buried capping patterns on the first and second buried plugs; and
    removing the material layer from the semiconductor substrate.

28. The method according to claim 22, wherein the first and second buried plugs are formed of a conductive material, and the first and second buried capping patterns are formed of an insulating material.

29. The method according to claim 22, further comprising:
forming an interconnection insulating layer between the active region and the first upper pattern and between the active region and the first lower pattern; and
forming impurity diffusion regions in the active region to be adjacent to the first lower pattern and overlap the first buried plug,
wherein each of the first and second lower patterns is a gate pattern, the interconnection insulating layer is formed of different materials between the active region and the first upper pattern and between the active region and the first lower pattern.

30. The method according to claim 22, further comprising:
forming an interconnection insulating layer between the active region and the first upper pattern and between the active region and the first lower pattern; and
forming impurity diffusion regions in the active region to be adjacent to the first lower pattern and overlap the first buried plug,
wherein each of the first and second lower patterns is a gate pattern, and the interconnection insulating layer is formed of the same material between the active region and the first upper pattern and between the active region and the first lower pattern.

* * * * *